(12) United States Patent
Crema

(10) Patent No.: US 11,948,806 B2
(45) Date of Patent: Apr. 2, 2024

(54) METHOD OF MANUFACTURING MULTI-DIE SEMICONDUCTOR DEVICES AND CORRESPONDING MULTI-DIE SEMICONDUCTOR DEVICE

(71) Applicant: STMicroelectronics S.r.l., Agrate Brianza (IT)

(72) Inventor: Paolo Crema, Vimercate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 214 days.

(21) Appl. No.: 17/549,280

(22) Filed: Dec. 13, 2021

(65) Prior Publication Data
US 2022/0199426 A1    Jun. 23, 2022

(30) Foreign Application Priority Data

Dec. 17, 2020    (IT) .......................... 102020000031226

(51) Int. Cl.
| | |
|---|---|
| *H01L 23/495* | (2006.01) |
| *H01L 21/48* | (2006.01) |
| *H01L 21/56* | (2006.01) |
| *H01L 23/31* | (2006.01) |

(52) U.S. Cl.
CPC ........ *H01L 21/4842* (2013.01); *H01L 21/565* (2013.01); *H01L 23/3107* (2013.01); *H01L 23/49503* (2013.01); *H01L 23/49575* (2013.01)

(58) Field of Classification Search
CPC .............. H01L 21/4842; H01L 21/565; H01L 23/3107; H01L 23/49503; H01L 23/49575
USPC ....................................................... 257/666
See application file for complete search history.

(56) References Cited

U.S. PATENT DOCUMENTS

| | | | |
|---|---|---|---|
| 7,009,286 B1 * | 3/2006 | Kirloskar ............ | H01L 21/4832 257/784 |
| 2017/0263572 A1 * | 9/2017 | Gong .................. | H01L 21/3205 |
| 2020/0321269 A1 * | 10/2020 | Chiang ............... | H01L 21/4825 |

FOREIGN PATENT DOCUMENTS

EP          3719834 A1       10/2020

OTHER PUBLICATIONS

IT Search Report and Written Opinion for priority application, IT 102020000031226, report dated Aug. 19, 2021, 9 pages.

* cited by examiner

*Primary Examiner* — Caleb E Henry
*Assistant Examiner* — Dilinh P Nguyen
(74) *Attorney, Agent, or Firm* — Crowe & Dunlevy

(57) ABSTRACT

In a method of manufacturing a multi-die semiconductor device, a metal leadframe includes a die pad and electrically-conductive leads arranged around the die pad. First and second semiconductor dice are arranged on the die pad. A laser-activatable material is disposed on the dice and leads, and a set of laser-activated lines is patterned, including a first subset coupling selected bonding pads of the dice to selected leads, a second subset coupling selected bonding pads amongst themselves, and a third subset coupling the lines in the second subset to at least one line in the first subset. A first metallic layer is deposited onto the laser-activated lines to provide first, second and third subsets of electrically-conductive lines. A second metallic layer is selectively deposited onto the first and second subsets by electroplating to provide first and second subsets of electrically-conductive tracks. The electrically-conductive lines in the third subset are selectively removed.

23 Claims, 3 Drawing Sheets

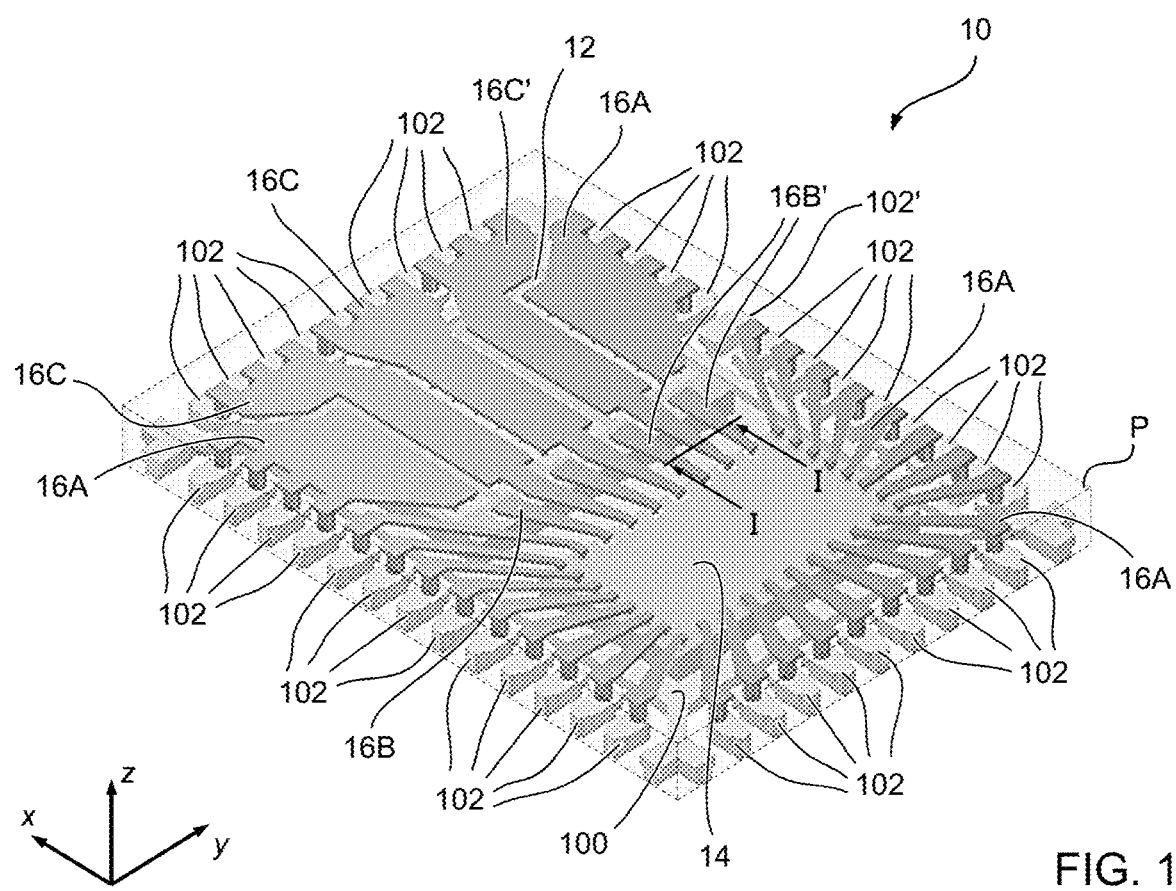
FIG. 1
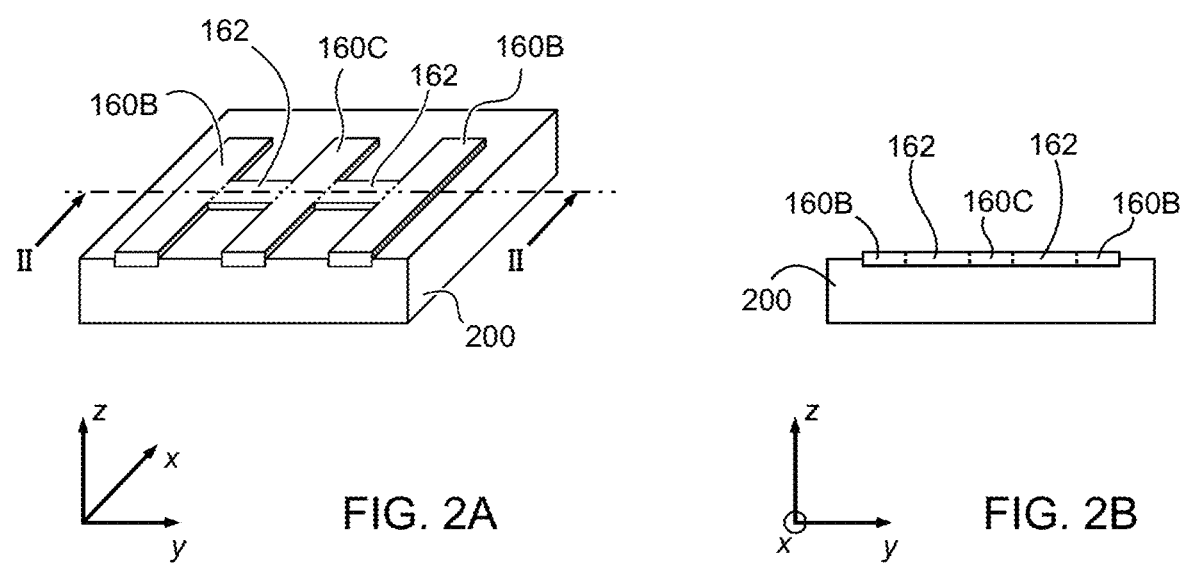
FIG. 2A
FIG. 2B

METHOD OF MANUFACTURING MULTI-DIE SEMICONDUCTOR DEVICES AND CORRESPONDING MULTI-DIE SEMICONDUCTOR DEVICE

PRIORITY CLAIM

This application claims the priority benefit of Italian Application for Patent No. 102020000031226, filed on Dec. 17, 2020, the content of which is hereby incorporated by reference in its entirety to the maximum extent allowable by law.

TECHNICAL FIELD

The description relates to multi-die or multi-chip semiconductor devices which may be suitable for use in various sectors such as the automotive, industrial, and consumer electronics sectors.

BACKGROUND

Conventional packaged multi-die semiconductor devices may include a metallic leadframe with a die pad and a set of electrically-conductive leads arranged around the die pad (e.g., extending radially therearound), a plurality of semiconductor dice arranged on the die pad (e.g., attached thereon), and a plastics package which encapsulates the semiconductor dice arranged on the die pad and at least a portion of the electrically-conductive leads facing towards the die pad.

In such multi-die semiconductor devices, each semiconductor die may be electrically coupled to one or more of the other semiconductor dice (e.g., to transmit and/or receive signals) by die-to-die interconnections. Conventionally, such die-to-die interconnections can be implemented by wire bonding, with the bonding wires also being encapsulated in the plastics package, or by electroless plating, or by selectively dispensing an electrically conductive paste (e.g., a silver paste) to form an electrically conductive track.

It is noted that implementing die-to-die interconnections by wire bonding, electroless plating, or dispensation of a conductive paste may lead to high manufacturing costs and/or low reliability of the die-to-die interconnections.

Therefore, there is a need in the art to provide improved die-to-die interconnections in multi-die semiconductor devices.

SUMMARY

One or more embodiments may relate to improved die-to-die interconnections in multi-die semiconductor devices.

One or more embodiments may relate to a corresponding multi-die semiconductor device.

In a method according to one or more embodiments, a metallic leadframe is provided which includes a die pad and a set of electrically-conductive leads arranged around the die pad. A set of semiconductor dice are arranged onto the die pad, the set of semiconductor dice including at least a first semiconductor die and a second semiconductor die. The first semiconductor die and the second semiconductor die include respective sets of bonding pads at their front surfaces which are opposed to the die pad. A layer of laser-activatable material (e.g., a plastic material) is formed (e.g., molded) onto the first semiconductor die, the second semiconductor die, and the set of electrically-conductive leads. Laser radiation is directed onto the laser-activatable material to pattern a set of laser-activated lines. The set of laser-activated lines includes a first subset of laser-activated lines configured to couple selected bonding pads of the first semiconductor die and/or the second semiconductor die to selected electrically-conductive leads in the set of electrically-conductive leads, a second subset of laser-activated lines configured to couple selected bonding pads of the first semiconductor die to selected bonding pads of the second semiconductor die, and a third subset of laser-activated lines configured to couple each of the laser-activated lines in the second subset of laser-activated lines to at least one laser-activated line in the first subset of laser-activated lines, and/or to at least one electrically-conductive lead in the set of electrically-conductive leads. A first metallic layer is deposited onto the first, second and third subsets of laser-activated lines to provide respective first, second and third subsets of electrically-conductive lines. A second metallic layer is selectively deposited onto the first and second subsets of electrically-conductive lines by electroplating to provide respective first and second subsets of electrically-conductive tracks. The electrically-conductive lines in the third subset of electrically-conductive lines are then selectively removed.

One or more embodiments may thus facilitate forming electrically floating metallic tracks (e.g., die-to-die interconnections) in a multi-die semiconductor device by a Laser Direct Structuring (LDS) process and a subsequent electroplating process, by forming temporary "tie-bars" which connect the electrically floating pattern regions to an electrically grounded region, and subsequently removing the temporary tie-bars.

BRIEF DESCRIPTION OF THE DRAWINGS

One or more embodiments will now be described, by way of example only, with reference to the annexed figures, wherein:

FIG. 1 is a perspective view exemplary of certain components of a multi-die semiconductor device according to one or more embodiments of the present description;

FIGS. 2A and 2B are perspective and cross-sectional views, respectively, of an electroless metal deposition step in a manufacturing method according to one or more embodiments of the present description;

Figure 4A:
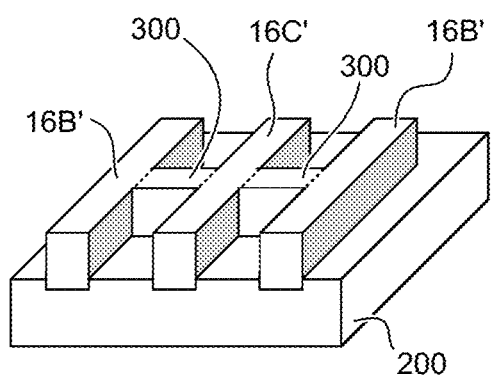
FIGS. 4A, 4B and 4C are perspective and cross-sectional views, respectively, of a metal electroplating step in a manufacturing method according to one or more embodiments of the present description.
Figure 4B:
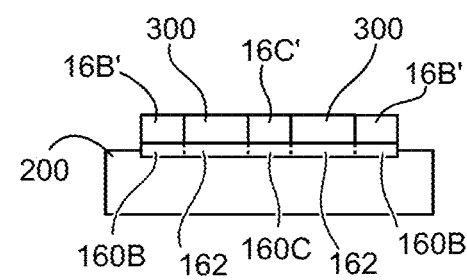
Figure 5A:
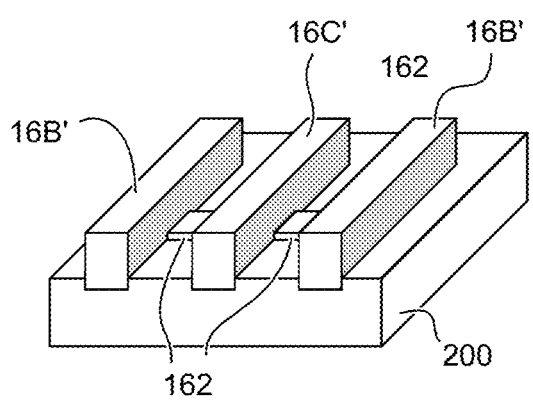
FIGS. 5A, 5B and 5C are perspective and cross-sectional views, respectively, of a mask removal step in a manufacturing method according to one or more embodiments of the present description.
Figure 5B:
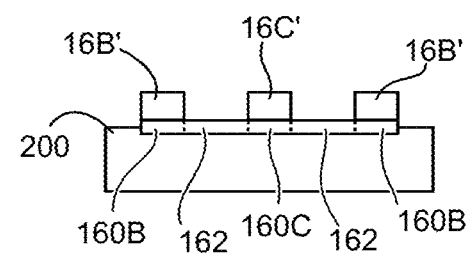
Figure 6A:
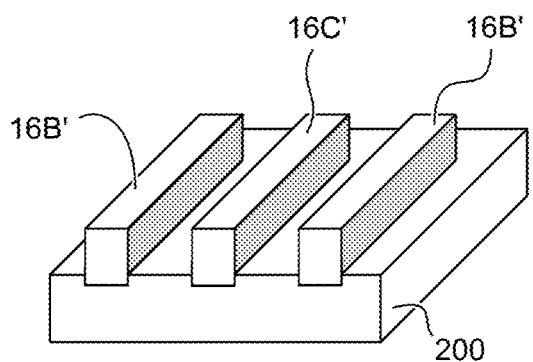
FIGS. 6A, 6B and 6C are perspective and cross-sectional views, respectively, of a metal etching step in a manufacturing method according to one or more embodiments of the present description.
Figure 6B:
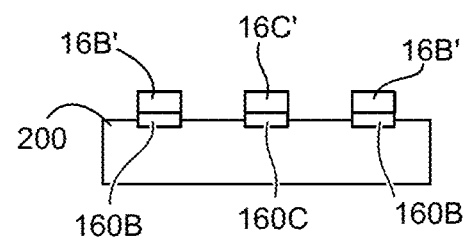
Figure 4C:
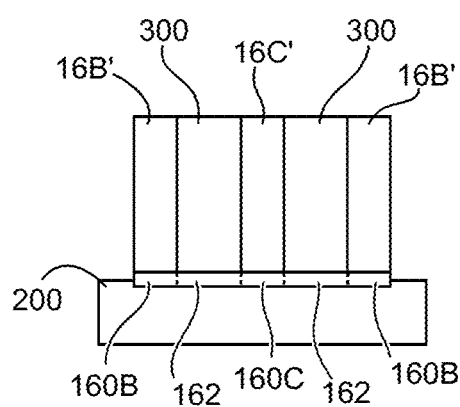
Figure 5C:
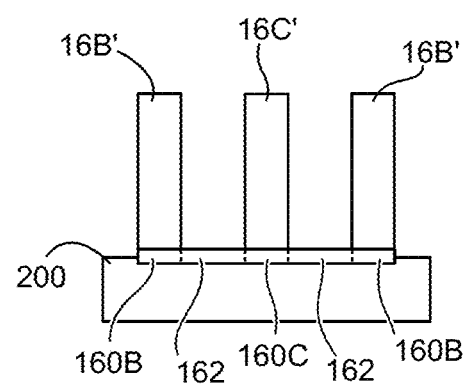
Figure 6C:
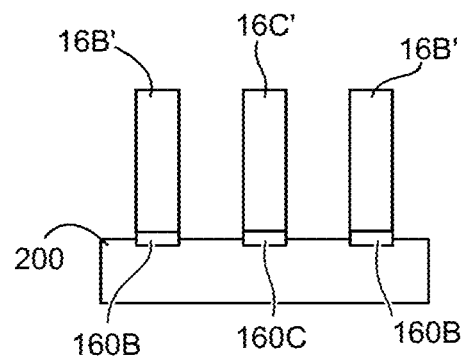

It will be appreciated that FIGS. 4C, 5C and 6C are grouped together at the end of the figures in order to facilitate comparisons therebetween.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The headings/references used herein are provided merely for convenience and hence do not define the extent of protection or the scope of the embodiments.

Throughout the figures annexed herein, unless the context indicates otherwise, like parts or elements are indicated with like references/numerals. For brevity, a corresponding description will not be repeated for each and every figure.

By way of introduction to the detailed description of exemplary embodiments, reference may first be made to FIG. 1.

FIG. 1 is a perspective view exemplary of certain internal components of a multi-die semiconductor device 10 comprising two semiconductor dice. In particular, the semiconductor device 10 exemplified herein comprises a quad flat no-leads package (e.g., a QFN package).

As exemplified in FIG. 1, the multi-die semiconductor device 10 comprises a metallic leadframe including a die pad 100 and a plurality of electrically-conductive leads 102 arranged around the die pad 100. A first semiconductor die 12 and a second semiconductor die 14 are arranged on the die pad 100, e.g., attached by die attach material such as a glue. A package P of plastic material (here shown in transparency and with dashed lines for the sake of illustration) encapsulates the semiconductor dice 12, 14 arranged on the die pad 100 and at least a portion of the electrically-conductive leads 102 facing towards the die pad 100.

The front (e.g., upper or top) surfaces of the semiconductor dice 12 and 14, i.e., the surfaces which are opposed to the die pad 100, are provided with bonding pads for electrically coupling the semiconductor dice 12, 14 to the leads 102 and/or between themselves. Depending on the connection scheme of the multi-die semiconductor device 10, three different cases may arise for such electrical interconnections.

In a first case, one or more electrical interconnections (see, for instance, the exemplary interconnections 16A in FIG. 1) may be provided between one (or more) of the electrically-conductive leads 102 of the leadframe and a semiconductor die (these may be designated as "die-to-lead" interconnections).

In a second case, one or more electrical interconnections (see, for instance, the exemplary interconnections 16B, 16B' in FIG. 1) may be provided between a semiconductor die and another semiconductor die (these may be designated as "die-to-die" interconnections).

In a third case, one or more electrical interconnections (see, for instance, the exemplary interconnections 16C, 16C' in FIG. 1) may be provided between one (or more) of the electrically-conductive leads 102 of the leadframe and a semiconductor die, and they may further extend to another semiconductor die, thereby implementing die-to-lead interconnections and die-to-die interconnections with a single, electrically-continuous interconnection.

Recent developments in the manufacturing technology of semiconductor devices relate to the use of the so-called Laser Direct Structuring (LDS) technology for manufacturing electrical interconnections in a semiconductor device. According to the LDS technology, a metallic inorganic compound activatable by laser radiation may be provided in the plastic material used for molding the package P (or at least a portion of the package P which is in contact with the semiconductor dice 12, 14). Laser radiation may then be directed onto the plastic material to pattern the course of the circuit trace on and in the laser-activatable plastic material. Where the laser radiation hits the plastic material, the metal additive forms a laser-activated (e.g., micro-rough) track or line. The metal particles of this laser-activated track or line form the nuclei for a subsequent metallization step which will grow an electrically-conductive track on the laser-activated plastic material.

Such a metallization step may comprise an electroless plating step (e.g., in a copper bath). Electroless plating may turn out to be disadvantageous, insofar as it may require long plating times in order to deposit a sufficiently thick metallic layer to provide satisfactory electrical conductivity for the die-to-die and die-to-lead interconnections 16A, 16B, 16C.

Additionally or alternatively, the metallization step may comprise an electroplating step (or galvanic deposition step). Such an electroplating step, however, is suitable for plating mainly those laser-activated tracks which provide a continuous electrical path towards a ground terminal during the electroplating process. Since the ground terminal is typically applied to the metallic leadframe, in a conventional manufacturing process the electroplating step would be suitable only for manufacturing die-to-lead interconnections such as the interconnections 16A, 16C and 16C' exemplified in FIG. 1. The electroplating step would not be suitable for manufacturing conventional die-to-die interconnections 16B and 16B', insofar as the die-to-die interconnections are electrically floating, i.e., they do not provide a continuous current path towards ground (e.g., towards the leadframe, in particular towards the electrically-conductive leads 102).

One or more embodiments of the present description relate to a manufacturing method which facilitates growing die-to-die metallic interconnections in a multi-die semiconductor device by means of an electroplating step.

A manufacturing method according to one or more embodiments may comprise the steps of providing a metallic leadframe including a die pad 100 and a set of electrically-conductive leads 102 arranged around the die pad, and arranging (e.g., attaching by a die attach material such as a glue) a set of semiconductor dice 12, 14 onto the die pad. As exemplified in FIG. 1, the set of semiconductor dice may include a first semiconductor die 12 and a second semiconductor die 14, but the number of semiconductor dice may vary in different embodiments (e.g., up to five, ten, or possibly more dice in the same packaged semiconductor device). The semiconductor dice 12, 14 comprise respective sets of bonding pads at their front (e.g., upper or top) surfaces.

A method according to one or more embodiments may further comprise the step of providing (e.g., molding) a layer of laser-activatable material 200 (e.g., a plastic material suitable for carrying out an LDS process) onto the semiconductor dice 12, 14 and the leads 102. For instance, the laser-activatable material 200 may be embedded in the molding compound which provides the package P. The catalytic (metallic) particles in the laser-activatable material 200 may have a size in the range of 0.5 μm to 2 μm.

Using LDS techniques, a method according to one or more embodiments may comprise the step of directing laser radiation onto the laser-activatable material 200 to pattern a set of laser-activated lines, which will be used as "seed" lines for one or more subsequent plating steps.

The set of laser-activated patterned lines may include: a first subset of lines configured to couple certain bonding pads of the semiconductor dice 12, 14 to certain leads 102 (i.e., once plated, the lines in the first subset will provide die-to-lead interconnections); a second subset of lines configured to couple certain bonding pads of a semiconductor die 12 to certain bonding pads of another semiconductor die 14 (i.e., once plated, the lines in the second subset will provide die-to-die interconnections); and a third subset of lines configured to couple each of the patterned lines in the second subset of patterned lines (which lack a connection to the leadframe) to at least one patterned line in the first subset of patterned lines, and/or to at least one lead 102 (i.e., once plated, the lines in the third subset will play the role of "sacrificial" laser-activated lines, according to the method steps further detailed in the following).

It is noted that, using LDS techniques, the laser-activated lines may not only extend at the surface of the material 200, but may also extend through the material 200 in order to provide vertical vias which allow establishment of connection with the bonding pads provided at the front surfaces of the semiconductor dice 12, 14 and/or with the leads 102.

A method according to one or more embodiments may further comprise the step of depositing (e.g., growing) by electroless plating a thin metallic layer (e.g., a copper layer) onto the first, second, and third subsets of laser-activated patterned lines to provide respective first, second, and third subsets of electrically-conductive lines. Purely by way of example, such a thin metallic layer may have a thickness in the range of 1 μm to 10 μm, optionally equal to 5 μm.

FIGS. 2A and 2B are exemplary of such electrically-conductive lines provided on the LDS material 200 after an electroless plating step. In particular, FIG. 2A is a perspective view (taken along line I-I of FIG. 1 and reproduced on an enlarged scale) of the LDS material and the electrically-conductive lines in a region between the semiconductor dice 12 and 14, and FIG. 2B is a cross-sectional view taken along line II-II of FIG. 2A in the y-z plane. It will be noted that such Figures, as well as the other Figures annexed herein, are not necessarily drawn to scale.

As exemplified in FIGS. 2A and 2B, after an electroless plating step, certain electrically-conductive lines may be provided on the LDS material 200. In particular, electrically-conductive lines 160C may be provided which couple the bonding pads of the semiconductor dice 12, 14 to the leads 102 (see again the corresponding interconnection 16C' in FIG. 1), and electrically-conductive lines 160B may be provided which couple the bonding pads of a semiconductor die 12 to the bonding pads of another semiconductor die 14 (see again the corresponding interconnection 16B' in FIG. 1). In order to provide a continuous current path for the lines 160B towards the leads 102 for a subsequent electroplating step, the laser activation step and the electroless plating step may additionally provide electrically-conductive lines 162 which couple each of the electrically-floating lines 160B to at least one line 160C and/or to at least one lead 102 (i.e., providing temporary "tie-bars" which allow coupling the otherwise electrically-floating lines 160B to the leadframe).

A method according to one or more embodiments may further comprise the step of selectively depositing (e.g., growing) by an electroplating process a thick metallic layer (e.g., a further copper layer) onto the electrically-conductive lines 160B and 160C to provide electrically-conductive tracks which implement respectively the interconnects 16A, 16B, 16B', 16C, and 16C'. For instance, such a thick metallic layer may have a thickness in the range of 50 μm to 60 μm, optionally equal to 55 μm.

Figure 3A:
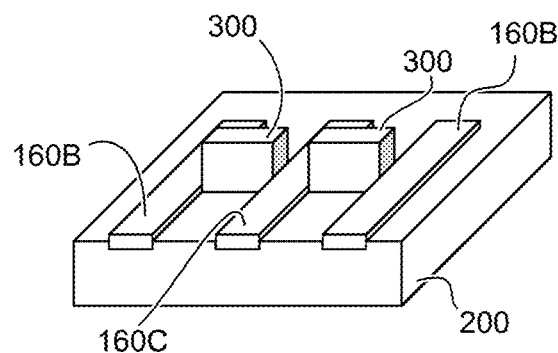
FIGS. 3A and 3B are perspective and cross-sectional views, respectively, of a masking step in a manufacturing method according to one or more embodiments of the present description.
Figure 3B:
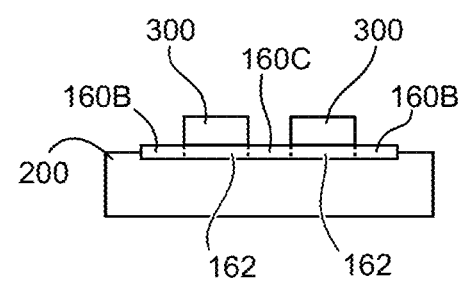

A selective metal deposition by electroplating may be carried out, for instance, by providing a masking layer 300 which covers the "sacrificial" electrically-conductive lines 162, as exemplified in FIGS. 3A and 3B. Such a masking layer may comprise a photoresist material patterned by photolithographic techniques, and/or any type of resist material selectively deposited onto the sacrificial electrically-conductive lines 162 by additive deposition techniques, such as ink-jet printing.

Once the sacrificial electrically-conductive lines 162 are covered by the masking layer 300 to prevent further metallic deposition on them, an electroplating step may be carried out as exemplified in FIGS. 4A, 4B and 4C, so that a thick metallic layer is deposited onto the electrically-conductive lines 160B and 160C to provide the interconnects 16A, 16B, 16B', 16C, and 16C'. FIG. 4C corresponds substantially to FIG. 4B, but it emphasizes the different thicknesses of the thin, electroless-deposited metallic layer comprising the lines 160B, 160C and 162, and the thicker, electroplated metallic layer implementing the tracks 16B' and 16C'.

In one or more embodiments, the thickness of the masking layer 300 may be selected to be equal to or higher than the desired thickness of the interconnects 16A, 16B, 16B', 16C, and 16C', so that the electroplating step may be stopped when the thickness of the electrodeposited metal layer is equal to or lower than the thickness of the masking layer 300. In this way, "lateral" growth of the thick metallic layer over the masking layer 300 may be countered (e.g., prevented). Therefore, the thickness of the masking layer 300 may generally be in the range of 10 μm to 60 μm, optionally equal to 50 μm or 55 μm.

Once the electroplating step is completed, as illustrated in FIGS. 4A, 4B and 4C, the masking layer 300 may be removed (e.g., by developing or stripping the resist material 300) as exemplified in FIGS. 5A, 5B and 5C. Removal of the masking layer 300 leaves the sacrificial electrically-conductive lines 162 exposed for further manufacturing steps.

A method according to one or more embodiments may further comprise the step of selectively removing the sacrificial electrically-conductive lines 162, as exemplified in FIGS. 6A, 6B and 6C. For instance, the sacrificial lines 162 may be removed by etching (e.g., by wet etching process and/or a dry etching process) the metallic layer(s) exposed at the surface of the LDS material 200.

In one or more embodiments, etching the sacrificial lines 162 may not require masking the interconnects 16A, 16B, 16B', 16C, and 16C' to protect them from the etching process, insofar as the etching time may be selected to be as short as necessary to remove the thin layer 162, resulting in a negligible decrease of the thickness of the interconnects 16A, 16B, 16B', 16C, and 16C'. Therefore, the final thickness of the interconnects 16A, 16B, 16B', 16C, and 16C' may be substantially determined by the duration of the electroplating step exemplified in FIGS. 4A, 4B and 4C, insofar as such thickness may roughly correspond to the thickness of the electroless-deposited metallic layer, plus the thickness of the electroplated metallic layer, minus the thickness of the etched material, where the thickness of the etched material is about the same as the thickness of the electroless-deposited metallic layer.

A method according to one or more embodiments may further comprise the step of providing an encapsulation layer of plastic material (not visible in the Figures annexed herein) to encapsulate the interconnects 16A, 16B, 16B', 16C and 16C'. The plastic material of such encapsulation layer may be, for instance, the same material 200 used for carrying out the LDS process, with or without the laser-activatable metal additive compound. Alternatively, the plastic material of the encapsulation layer may be a different one.

Various embodiments have been described with reference to the annexed Figures, wherein the sacrificial electrically-conductive lines 162 are illustrated as coupling the electrically-floating die-to-die lines 160B to one or more of the die-to-lead lines 160C. Additionally or alternatively, one or more embodiments may comprise providing sacrificial electrically-conductive lines 162 which couple the electrically-floating die-to-die lines 160B to one or more of the leads 102.

For instance, in one or more embodiments there may be some of the leads 102 of the leadframe which are not expected to be coupled to any of the semiconductor dice 12, 14 in the device 10. Such "free" leads (see, for instance, the lead 102' in FIG. 1) may be used to provide a connection to ground for a die-to-die line 160B via a "dedicated" sacrificial line 162.

As exemplified herein, a method of manufacturing a multi-die semiconductor device (e.g., 10) may include providing a metallic leadframe including a die pad (e.g., 100) and a set of electrically-conductive leads (e.g., 102) arranged around the die pad, and arranging a set of semiconductor dice (e.g., 12, 14) onto the die pad, the set of semiconductor dice including at least a first semiconductor die (e.g., 12) and a second semiconductor die (e.g., 14). The first semiconductor die and the second semiconductor die comprise respective sets of bonding pads at their front surfaces opposed to the die pad. The method may further include forming (e.g., molding) a layer of laser-activatable material (e.g., 200) onto the first semiconductor die, the second semiconductor die and the set of electrically-conductive leads, and directing laser radiation onto the layer of laser-activatable material to pattern a set of laser-activated lines.

The set of laser-activated lines includes: i) a first subset of laser-activated lines configured to couple selected bonding pads of the first semiconductor die and/or the second semiconductor die to selected electrically-conductive leads in the set of electrically-conductive leads, ii) a second subset of laser-activated lines configured to couple selected bonding pads of the first semiconductor die to selected bonding pads of the second semiconductor die, and iii) a third subset of laser-activated lines configured to couple each of the laser-activated lines in the second subset of laser-activated lines to at least one laser-activated line in the first subset of laser-activated lines, and/or to at least one electrically-conductive lead in the set of electrically-conductive leads.

The method further includes depositing a first metallic layer onto the first, second and third subsets of laser-activated lines to provide respective first (e.g., 160C), second (e.g., 160B) and third (e.g., 162) subsets of electrically-conductive lines, selectively depositing a second metallic layer onto the first and second subsets of electrically-conductive lines by electroplating to provide respective first (e.g., 16C', 16C) and second (e.g., 16B', 16B) subsets of electrically-conductive tracks, and selectively removing the electrically-conductive lines in the third subset of electrically-conductive lines.

As exemplified herein, the method may comprise depositing the first metallic layer by means of electroless plating.

As exemplified herein, selectively depositing the second metallic layer onto the first and second subsets of electrically-conductive lines may comprise providing a masking material (e.g., 300) onto the electrically-conductive lines in the third subset of electrically-conductive lines to prevent galvanic deposition of the second metallic layer onto the electrically-conductive lines in the third subset of electrically-conductive lines.

As exemplified herein, the thickness of the masking material may be in the range of 10 μm to 60 μm, optionally equal to 50 μm or 55 μm.

As exemplified herein, the method may comprise providing the masking material onto the electrically-conductive lines in the third subset of electrically-conductive lines by photo-patterning a photoresist material.

As exemplified herein, the method may comprise providing the masking material onto the electrically-conductive lines in the third subset of electrically-conductive lines by selectively depositing a resist material, optionally by ink-jet printing.

As exemplified herein, the thickness of the first metallic layer deposited onto the first, second and third subsets of laser-activated lines may be in the range of 1 μm to 10 μm, optionally equal to 5 μm.

As exemplified herein, the thickness of the second metallic layer deposited onto the first and second subsets of electrically-conductive lines may be in the range of 50 μm to 60 μm, optionally equal to 55 μm.

As exemplified herein, selectively removing the electrically-conductive lines in the third subset of electrically-conductive lines may comprise etching the electrically-conductive lines in the third subset of electrically-conductive lines.

As exemplified herein, the method may comprise forming (e.g., molding) an encapsulation layer of plastic material encapsulating the first and second subsets of electrically-conductive tracks.

As exemplified herein, a multi-die semiconductor device may include a metallic leadframe including a die pad and a set of electrically-conductive leads arranged around the die pad, a set of semiconductor dice arranged onto the die pad, the set of semiconductor dice including at least a first semiconductor die and a second semiconductor die, wherein the first semiconductor die and the second semiconductor die comprise respective sets of bonding pads at their front surfaces opposed to the die pad.

The multi-die semiconductor device may further include a layer of laser-activatable material molded onto the first semiconductor die, the second semiconductor die and the set of electrically-conductive leads, wherein the laser-activatable material comprises a set of laser-activated lines including: i) a first subset of laser-activated lines coupling selected bonding pads of the first semiconductor die and/or the second semiconductor die to selected electrically-conductive leads in the set of electrically-conductive leads, and ii) a second subset of laser-activated lines coupling selected bonding pads of the first semiconductor die to selected bonding pads of the second semiconductor die.

The multi-die semiconductor device may further include a first metallic layer deposited onto the first and second subsets of laser-activated lines, and a second metallic layer deposited onto the first metallic layer.

As exemplified herein, the first metallic layer may comprise electroless-plated metallic material and the second metallic layer may comprise electroplated metallic material. The electroless-plated metallic material and the electroplated metallic material may have, for instance, a different morphology as a consequence of the difference deposition rates.

Without prejudice to the underlying principles, the details and embodiments may vary, even significantly, with respect to what has been described by way of example only, without departing from the extent of protection.

The invention claimed is:

1. A method, comprising:
   arranging a set of semiconductor dice on a die pad of a metallic leadframe, said set of semiconductor dice including a first semiconductor die and a second semiconductor die, wherein the first semiconductor die and the second semiconductor die each have sets of bonding pads at their front surfaces opposed to the die pad;
   forming a layer of laser-activatable material on said first semiconductor die, said second semiconductor die, and a set of electrically-conductive leads of the metallic leadframe arranged around the die pad;
   directing laser radiation on said layer of laser-activatable material to pattern a set of laser-activated lines, wherein said set of laser-activated lines include:
      i) a first subset of laser-activated lines configured to couple selected bonding pads of one or more of said first semiconductor die and said second semiconductor die to selected electrically-conductive leads in said set of electrically-conductive leads;
      ii) a second subset of laser-activated lines configured to couple selected bonding pads of said first semiconductor die to selected bonding pads of said second semiconductor die; and
      iii) a third subset of laser-activated lines configured to couple each of said laser-activated lines in said second subset of laser-activated lines to one or more of at least one laser-activated line in said first subset of laser-activated lines, and at least one electrically-conductive lead in said set of electrically-conductive leads;
   depositing a first metallic layer on said first, second, and third subsets of laser-activated lines to provide respective first, second, and third subsets of electrically-conductive lines;
   selectively depositing a second metallic layer on said first and second subsets of electrically-conductive lines, but not the third subset of electrically-conductive lines, by electroplating to provide respective first and second subsets of electrically-conductive tracks; and
   selectively removing said third subset of electrically-conductive lines.

2. The method of claim 1, wherein the first metallic layer is deposited by electroless plating.

3. The method of claim 2, wherein selectively depositing said second metallic layer on said first and second subsets of electrically-conductive lines comprises providing a masking material on said electrically-conductive lines in said third subset of electrically-conductive lines to prevent galvanic deposition of said second metallic layer on said electrically-conductive lines in said third subset of electrically-conductive lines during electroplating.

4. The method of claim 1, wherein selectively depositing said second metallic layer on said first and second subsets of electrically-conductive lines comprises providing a masking material on said electrically-conductive lines in said third subset of electrically-conductive lines to prevent galvanic deposition of said second metallic layer on said electrically-conductive lines in said third subset of electrically-conductive lines during electroplating.

5. The method of claim 4, wherein said masking material has a thickness in a range of 10 µm to 60 µm.

6. The method of claim 4, wherein providing said masking material on said electrically-conductive lines in said third subset of electrically-conductive lines comprises photo-patterning a photoresist material.

7. The method of claim 4, wherein providing said masking material on said electrically-conductive lines in said third subset of electrically-conductive lines comprises selectively depositing a resist material.

8. The method of claim 7, wherein selectively depositing the resist material comprises depositing by ink-jet printing.

9. The method of claim 1, wherein said first metallic layer deposited on said first, second, and third subsets of laser-activated lines has a thickness in a range of 1 µm to 10 µm.

10. The method of claim 1, wherein said first metallic layer deposited on said first, second, and third subsets of laser-activated lines has a thickness equal to 5 µm.

11. The method of claim 1, wherein said second metallic layer deposited on said first and second subsets of electrically-conductive lines has a thickness in a range of 50 µm to 60 µm.

12. The method of claim 1, wherein said second metallic layer deposited on said first and second subsets of electrically-conductive lines has a thickness equal to 55 µm.

13. The method of claim 1, wherein selectively removing said electrically-conductive lines in said third subset of electrically-conductive lines comprises etching said electrically-conductive lines of said third subset of electrically-conductive lines.

14. The method of claim 1, further comprising forming an encapsulation layer of plastic material encapsulating said first and second subsets of electrically-conductive tracks.

15. A method, comprising:
   arranging first and second semiconductor dice onto a die pad of a metallic leadframe, wherein the first semiconductor die and the second semiconductor die each have sets of bonding pads at their front surfaces which are opposed to the die pad;
   forming a layer of laser-activatable material onto said first semiconductor die, said second semiconductor die, and a set of electrically-conductive leads of the metallic leadframe arranged around the die pad;
   patterning a set of laser-activated lines in said layer of laser-activatable material to include:
      i) a first subset of laser-activated lines configured to couple selected bonding pads of said first semiconductor die to selected electrically-conductive leads in said set of electrically-conductive leads;
      ii) a second subset of laser-activated lines configured to couple selected bonding pads of said first semiconductor die to selected bonding pads of said second semiconductor die; and
      iii) a third subset of laser-activated lines configured to couple each of said laser-activated lines in said second subset of laser-activated lines to at least one laser-activated line in said first subset of laser-activated lines;
   depositing a first metallic layer onto said first, second, and third subsets of laser-activated lines to provide respective first, second, and third subsets of electrically-conductive lines;
   selectively depositing a second metallic layer onto said first and second subsets of electrically-conductive lines to provide respective first and second subsets of electrically-conductive tracks; and selectively removing said electrically-conductive lines in said third subset of electrically-conductive lines.

16. The method of claim 15, wherein the first metallic layer is deposited by electroless plating.

17. The method of claim 16, wherein selectively depositing said second metallic layer on said first and second subsets of electrically-conductive lines comprises providing a masking material on said electrically-conductive lines in said third subset of electrically-conductive lines.

18. The method of claim 15, wherein selectively depositing said second metallic layer on said first and second subsets of electrically-conductive lines comprises providing a masking material on said electrically-conductive lines in said third subset of electrically-conductive lines to prevent galvanic deposition of said second metallic layer on said electrically-conductive lines in said third subset of electrically-conductive lines.

19. The method of claim 18, wherein said masking material is provided on said electrically-conductive lines in said third subset of electrically-conductive lines by patterning a photoresist material.

20. The method of claim 18, wherein said masking material is provided on said electrically-conductive lines in said third subset of electrically-conductive lines by selectively depositing a resist material.

21. The method of claim 20, wherein the resist material is selectively deposited by ink-jet printing.

22. The method of claim 15, wherein selectively removing said electrically-conductive lines in said third subset of electrically-conductive lines comprises etching said electrically-conductive lines of said third subset of electrically-conductive lines.

23. The method of claim 15, further comprising forming an encapsulation layer of plastic material encapsulating said first and second subsets of electrically-conductive tracks.

* * * * *